United States Patent [19]

Kendall et al.

[11] 3,936,329

[45] Feb. 3, 1976

[54] INTEGRAL HONEYCOMB-LIKE SUPPORT OF VERY THIN SINGLE CRYSTAL SLICES

[75] Inventors: Don Leslie Kendall, Richardson; John C. Knowles, Jr., Dallas, both of Tex.

[73] Assignee: Texas Instruments Incorporated, Dallas, Tex.

[22] Filed: Feb. 3, 1975

[21] Appl. No.: 546,378

[52] U.S. Cl. .................. 148/187; 29/580; 148/175; 156/17
[51] Int. Cl.² ......................................... H01L 21/20
[58] Field of Search ...... 148/175, 187; 29/572, 580; 156/7, 17

[56] References Cited
UNITED STATES PATENTS

| | | | |
|---|---|---|---|
| 3,403,439 | 10/1968 | Bailey | 29/580 X |
| 3,425,879 | 2/1969 | Shaw et al. | 148/175 |
| 3,536,600 | 10/1970 | Van Dijk et al. | 29/580 X |
| 3,616,345 | 10/1971 | Van Dijk | 29/580 X |
| 3,767,494 | 10/1973 | Muraoka et al. | 156/17 |
| 3,810,791 | 5/1974 | Kendall | 148/175 X |
| 3,810,796 | 5/1974 | Skaggs et al. | 156/17 X |

*Primary Examiner*—L. Dewayne Rutledge
*Assistant Examiner*—J. M. Davis
*Attorney, Agent, or Firm*—Harold Levine; James T. Comfort; Gary C. Honeycutt

[57] ABSTRACT

The disclosure relates to the formation of very thin silicon slices, 1/10 of a mil, and the mechanical strengthening of such thin silicon slices and to the formation of electronic circuitry in such slices and the use thereof. These slices are formed, in accordance with one embodiment of the invention, by etching grooves in an n+ wafer using an orientation dependent etch and etching along the 111 plane in 110 n+ wafers. After oxide removal, the surface of the wafer opposite the grooves is epitaxially coated with n-type silicon and the original grooves are then further etched by an electrolytic etch or by a concentration dependent etch which will remove only the n+ material, thereby leaving the thin wafer with a honeycomb-like supporting structure with struts in the shapes of parallelograms, diamonds and the like.

The thin slice can be used to purify electron beams since, for given energies, only ions passing in the direction of the lattice structure or along the channel will completely pass through the slice, the other ions being stopped by collisions with the atoms of the silicon slice. The slice can also be used as a channel multiplier since light impinging on the slice will generate electrons which will pass between struts or honeycomb-like members and gradually pick up additional electrons by secondary emission. These electrons are made to fall on a phosphor screen or the like whereby light is again generated, but in multiplied fashion.

16 Claims, 13 Drawing Figures

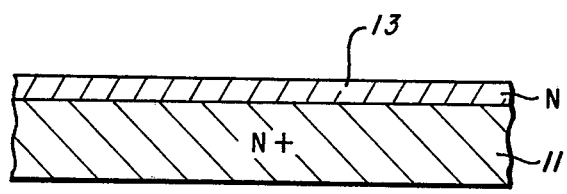
Fig. 2a
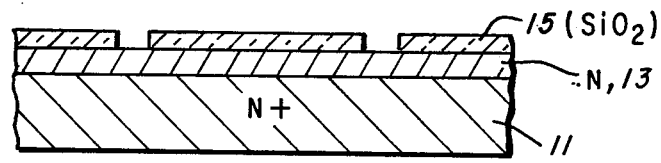
Fig. 2b
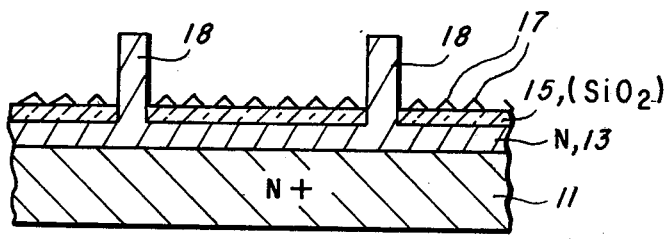
Fig. 2c
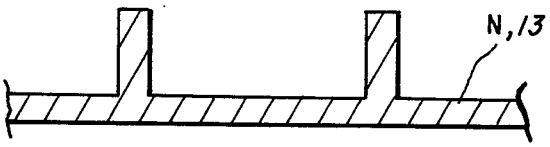
Fig. 2d
Fig. 3
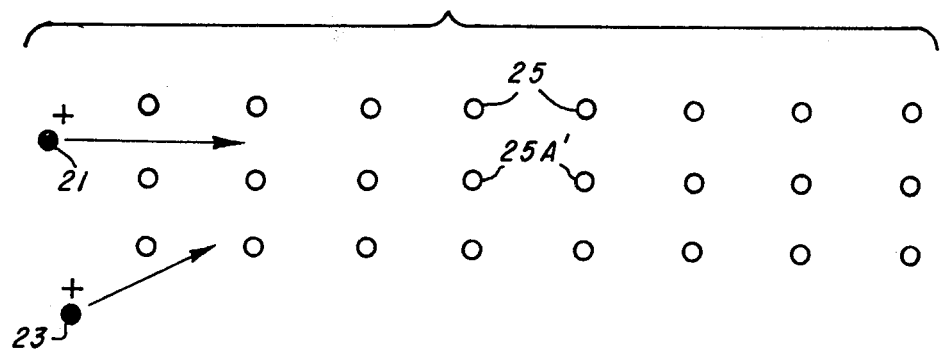

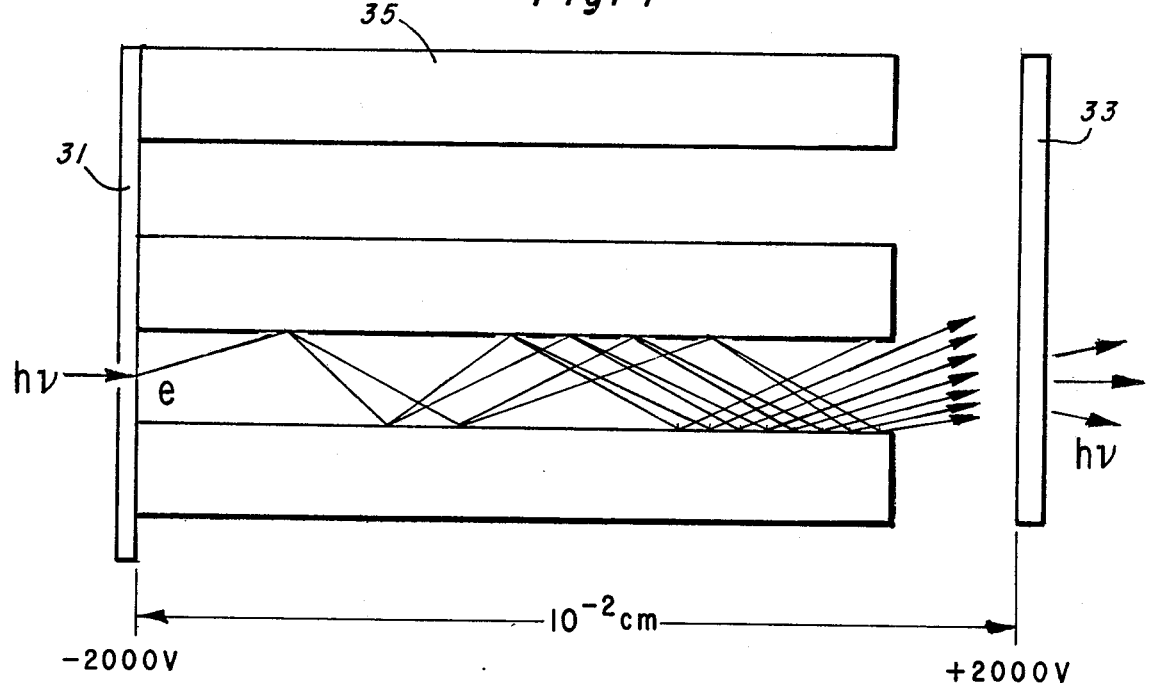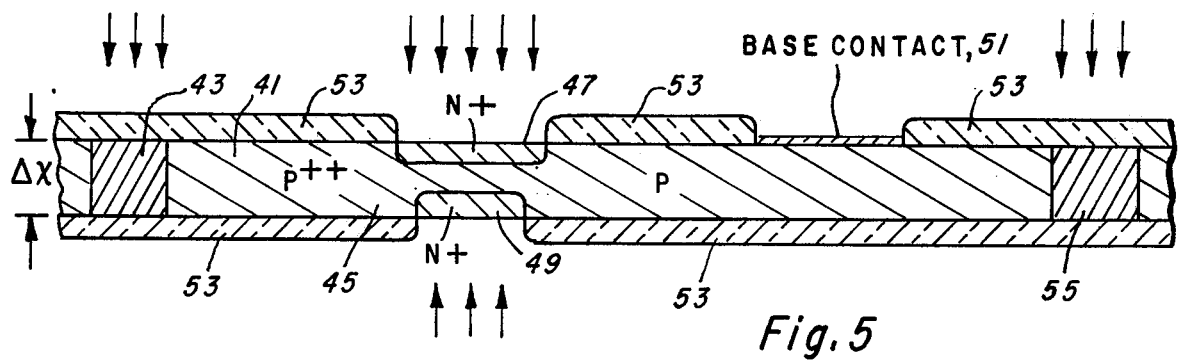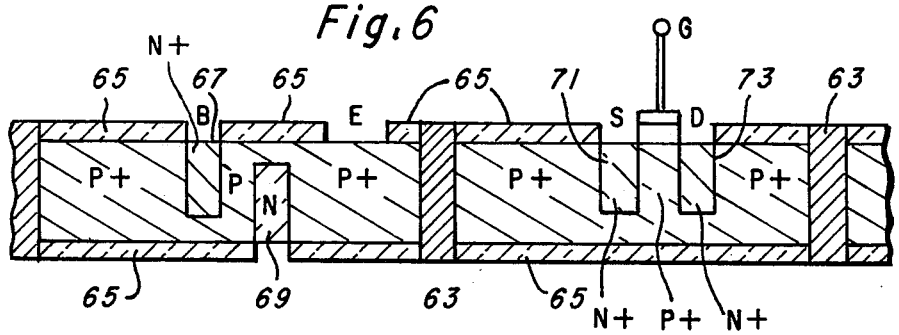

INTEGRAL HONEYCOMB-LIKE SUPPORT OF VERY THIN SINGLE CRYSTAL SLICES

This invention relates to the formation and processing of very thin semiconductor slices and, more specifically, to the formation and processing of such slices which are accessible from both sides and are sufficiently strong due to struts or the like thereon so that they can be maintained flat and handleable for operation thereon from both sides.

Very thin semiconductor slices on the order of 1/10 of a mil would appear to have great utility in the present semiconductor technology since, theoretically, they can be operated upon the device formation from both sides and provide other unique properties. Unfortunately, the formation of semiconductor devices and the like in such thin semiconductor slices has not met with success due to the inability to maintain such slices straight and flat and, even more important, due to the fact that slices of such thin dimensions are not equally handleable and therefore cannot be utilized in semiconductor processing steps on a commercial basis.

In accordance with the present invention, the above problems of the prior art are overcome and there is provided a very thin semiconductor slice on the order of 1/10 of a mil in thickness, which is sufficiently flat and straight and has sufficient strength for processing and later use on a commercial scale. There are also provided several uses of such thin slices wherein components can be formed from both sides of the slice and wherein the slice itself can perform various functions heretofore unavailable on a commercial basis. Briefly, in accordance with one embodiment of the invention, by etching grooves in an $n+$ wafer using an ODE and etching along the {111} plane in {110} $n+$ wafers. After oxide removal, the surface of the wafer opposite the grooves is epitaxially coated with n-type silicon and the grooves are then further etched by an electrolytic etch or by a concentration dependent etch such as 1:3:8 by volume of stock solutions of $HF:HNO_3$:Acetic which will remove only the $n+$ material, thereby leaving the thin wafer with supporting structures such as struts, parallelogram, honeycomb, diamond and the like.

In accordance with the second embodiment of the invention, the thin silicon slices are formed by depositing or forming an n-type region over a {110} $n+$ wafer. Silicon oxide is then grown or deposited over the n-type region and holes are opened therein. Single crystal silicon is then deposited through the holes to form struts, diamonds or whatever shape of opening was formed into the silicon oxide, there being negligible polycrystalline silicon formed on the oxide using well-known orientation dependent growth conditions. The $n+$ region is then removed by electrolytic processes or by use of the well-known concentration dependent etch mentioned earlier. The oxide and polycrystalline silicon are removed by etching the oxide with hydrofluoric acid.

The thin slice can be used to purify electron beams since, for given energies, only ions passing in the direction of the lattice structure or along the channel will completely pass through the slice, the other ions being stopped by collisions with the atoms of the silicon slice. The slice can also be used as a channel multiplier since light impinging on the slice will generate electrons which will pass between struts or honeycomb-like members and which, if biased along the grooves with an electric field exceeding about $2 \times 10^5$ volts/cm will pick up additional electrons by secondary emission. These electrons are made to fall on a phosphor screen or the like whereby light is again generated, but in multiplied fashion.

Semiconductor devices can be formed in the thin slice by any of the well-known techniques which are compatible therewith. However, due to the thinness of the slice, regions can be formed by operations from both sides of the slice, such as by ion implantation to form p-type, n-type or isolation regions, localized out-diffusion caused by ion bombardment and the like.

It is therefore an object of this invention to provide very thin single crystal semiconductor slices which can be maintained straight and flat and which are handleable without breakage on a commercial basis.

It is a further object of this invention to provide very thin semiconductor slices which are accessible thereon from both sides.

It is yet a further object of this invention to provide very thin semiconductor slices having struts thereon of predetermined shape to provide strength to the slice and prevent breakage thereof during handling.

The above objects and still further objects of the invention will immediately become apparent to those skilled in the art after consideration of the following preferred embodiments thereof, which are provided by way of example and not by way of limitation wherein:

FIGS. 2a to 2d show the steps required to provide thin semiconductor slices in accordance with a second embodiment of the present invention;

FIG. 3 is a diagram of a beam purifier in accordance with the present invention;

FIG. 4 is a diagram of a photomultiplier in accordance with the present invention;

FIG. 5 shows the formation of a first semiconductor structure in a thin semiconductor slice in accordance with the present invention;

FIG. 6 shows the formation of a second semiconductor structure in a thin semiconductor slice in accordance with the present invention.

Figure 1A:
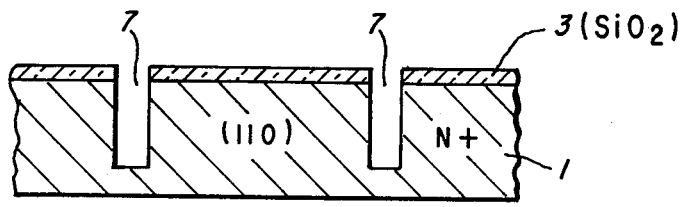
FIGS. 1a to 1e show the steps required to provide thin semiconductor slices in accordance with a first embodiment of the present invention.
Figure 1B:
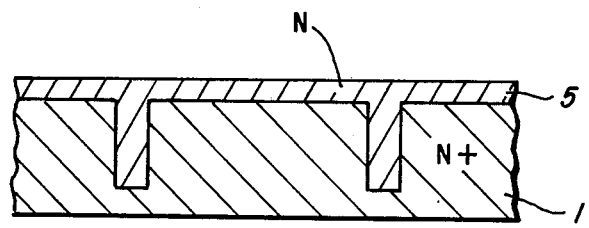
Figure 1C:
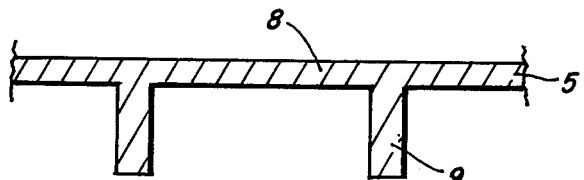
Figure 1D:
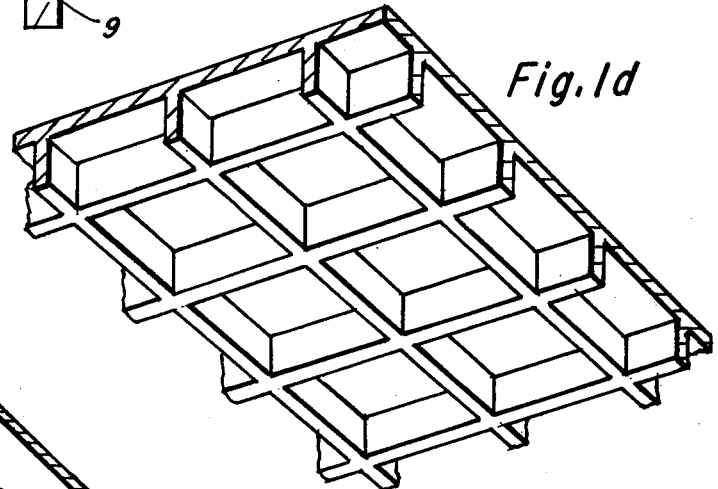
Figure 1E:
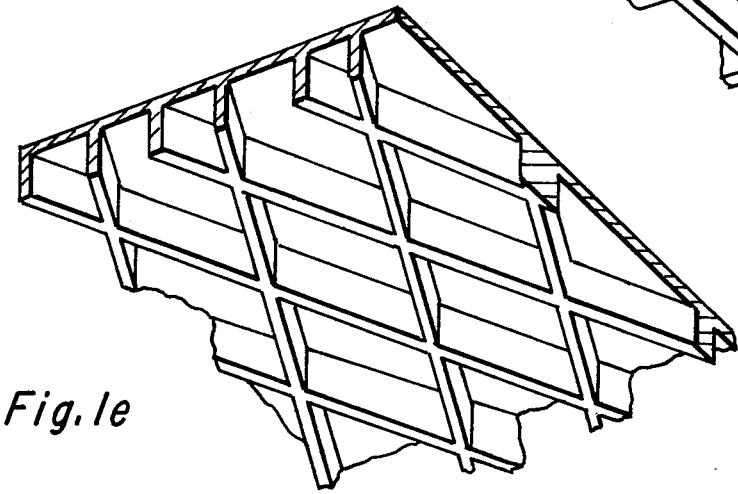

Referring first to FIGS. 1a to 1c, there is shown a first method for forming thin semiconductor slices in accordance with the present invention. It should be understood that though the discussion will be presented with respect to a starting $n+$ silicon wafer, other conductivity types of silicon can be used as can the other semiconductor material such as germanium, gallium arsenide and the like. Therefore, the invention is not restricted just to silicon. Referring now specifically to FIG. 1a, there is provided an $n+$ silicon wafer with {110} crystallographic orientation 1 onto which a mask of silicon oxide 3 has been formed. The wafer which is of {110} orientation is then etched with an orientation dependent etch (ODE) along the {111} planes to provide rectangularly shaped grooves 7. The bottom of the groove may also be V-shaped. The oxide is then removed and n-type material 5 is then deposited into the grooves 7 as well as on the surface of the wafer 1, as shown in FIG. 1b. The $n+$ region 1 is now removed by standard methods. Such methods could be electrolytic etch or by the use of the well-known 1:3:8 etch which is one part HF, 3 parts $HNO_3$ and 8 parts acetic acid. The final structure will have a flat semiconductor surface 8 which is approximately 1/10 mil across and struts 9 which are 1/10 mil to 2 mils across in their short dimensions. The final structure in FIG. 1c is shown as a flat semiconductor slice with struts 9 thereon. However, it should be understood that the struts 9 could be in the form of parallelograms as shown in FIG. 1d. In FIG. 1d, only the strut portion is actually shown, it being understood that either the top or bottom of the parallelogram struts would include the very thin semiconductor slice portion. The formation of these reinforcing walls in purely dependent upon the initial masking in FIG. 1a. However, in order to form the parallelograms with optimum geometries, it will be required to repeat the steps shown in FIGS. 1a and 1b before proceeding to the n+ removal step. Thus after forming the structure shown in FIG. 1b, the slice is re-oxidized in steam, and patterned with narrow parallel openings as before, but along the other set of {111} planes that intersect the surface {110} plane at 90°. These openings lie at an angle of about 70.5° to the first set of openings. After etching this second set of grooves using an orientation dependent etch and thereafter removing the oxide coating, the grooves are filled with n-type silicon as before. Finally, the n+ silicon is removed, thereby forming the structure shown in FIG. 1d.

Referring now to FIGS. 2a to 2d, there is shown a second embodiment for formation of thin semiconductor slices in accordance with the present invention. Again, the procedure starts with an n+ slice of silicon 11, over which is formed a layer 13 of n-type silicon. A relatively thick oxide coating 15 is then formed over the layer 13, the oxide layer then being etched in accordance with the desired pattern. This is shown in FIG. 2b. Silicon is then deposited over the device shown in FIG. 2b to form struts 18 as well as depositing some polycrystalline silicon 17 onto the oxide layer 15 as shown in FIG. 2c. The n+ layer is then removed by electrolytic etching or by use of the 1:3:8 etch as mentioned with regard to the embodiment of FIG. 1, and the oxide layer 15 and polycrystalline silicon 17 is removed, in standard manner, such as by the use of HF, to provide the final structure as shown in FIG. 2d.

The device formed by the methods of FIGS. 1 and 2 can be used, for example, as an ion beam divergence purifier. Referring to FIG. 3, the dots 25 represent the atoms which make up the thin portion of the silicon slice. These atoms are therefore formed according to a known lattice structure and have channels between the groups of atoms. It can be seen that if an ion 21 passes with sufficient energy along a straight path along a channel when entering the thin slice, it would pass between atoms 25 and 25A and emerge from the other side of the slice. On the other hand, an atom 23 which is coming in at an angle larger than the critical angle with respect to the channel, will stack up within the thin slice and not emerge. In this way, the ion beam is purified to remove divergent ions that enter the lattice at angles greater than the critical angle. The critical angle has a magnitude of several degrees for large ions such as arsenic or gallium but is only a small fraction of a degree for hydrogen ions (protons).

The description with regard to FIG. 3 can be extended to form erasable masks within the semiconductor slice. If a very low energy beam of ion enters the slice, they are all stacked up in the channel. Furthermore, if the energy is low enough, the entering atoms will not displace silicon atoms in the lattice structure even if a head-on collison occurs. Therefore, the ions entering the lattice structure can be stacked up in a predetermined array to form a mask by eventually clogging up the channel and preventing the movement of ion therethrough. Such a mask could be erasable and would be compatible with all-vacuum processing of semiconductor devices. Erasing can take place by heating up the slice to about 700°C in order to open up the lattice structure as is well known in the art. The plugged lattice structure could also be utilized in the formation of semiconductor devices in conventional thick slices since they could be used to act as a plug against later impurity implants in the zones in which the mask has been formed.

The structure provided in FIGS. 1 and 2 can also be used as a channel multiplier by use of the photoelectric effect as shown in FIG. 4. A negative voltage is placed, for example, on the thin slice portion 31 and a phosphor screen 33 is provided with a positive voltage impressed thereon. Light, $h\nu$, which impinges upon the slice 31 will release electrons which will travel in the channel between struts 35, the electrons striking the struts 35 and bouncing back and forth therein to provide even additional electrons due to the secondary emission. In this way, the number of electrons striking the phosphor screen 33 is enhanced to provide a multiplication of the amount of light initially impinging upon the thin slice 31. This is accomplished since it is known that impact ionization in silicon, gallium arsenide and several other semiconductor materials occurs at an electric field of about $2 \times 10^5$ volts per centimeter. Any field greater than this, for a given semiconductor or insulator-like silicon dioxide or glass, will cause impact ionization. In the structure of FIG. 4, a field of about $4 \times 10^5$ volts per centimeter is applied from one side of the structure to the other, by impressing 4000 volts across a structure of $10^{-2}$ centimeters. The front of this structure is made into a photo-emitter by cesiation thereof. The thin front can be silicon itself, or it can be coated with gallium arsenide, gallium phosphide or other photo-emitting materials. The supporting structure can be made of silicon, gallium arsenide, gallium phosphide or other materials capable of electron multiplication. For example, if the structure were originally made from single crystal silicon, its surface would be treated to cause efficient electron multiplication. Alternatively, the structure could be oxidized to form a silicon dioxide supporting structure which would then be coated with material to cause more efficient multiplication. The channel walls could either be the same as the thin photo-emitter material or could be of a different material. In still another variant, the photo-emitter would be separated from the honeycomb-like structure by a small distance, thereby not requiring the integral thin region. The advantage of such a channel multiplier would be that it provides more open area for electron multiplication than is possible using the space between small glass fiber arrays as used in the prior art. The transmission or open area represents only 21.5% of the total area in the prior art glass bundle, but it could be about 81% in the structure, such as in FIG. 1d of the present invention for struts of 0.1 mils thickness separated by 1.0 mils. Furthermore, in conjunction with the photoemitter, it can provide signal amplification or energy intensification of the original light signal. Also, the photoemitter and channel multiplier can be made an integral part of each other, thereby simplifying the manufacturing process and providing for more efficient electron collection.

Referring now to FIG. 5, there is shown the formation of a semiconductor device on the thin silicon slices of the present invention. The devices are formed between the struts or wall patterns as shown in FIGS. 1 and 2 starting with a P++ slice 41, there being an isolation region 43 formed by implanting an isolation material such as oxygen, nitrogen or carbon to form silicon oxide, silicon nitride, or silicon carbide. The P-type region at 45 is formed by ion-enhanced out-diffusion of boron. This is accomplished by bombarding with protons in the P++ region 45 sufficiently to out-diffuse enough of the boron impurity therein so that a remaining slow diffusing impurity such as indium will determine the final concentration. This is most readily accomplished using the technique of U.S. Pat. No. 3,810,791, "Process for the Fabrication of Semiconductor Materials" - Don L. Kendall. The emitter 47 and collector 49 are formed by ion implantation of an n-type impurity, such as arsenic or phosphorous. It can be seen that impurities have been entered into selected portions of the thin slice 41 which was the starting material. As is well known, the depth of penetration of the ion beam will depend upon the thickness of the slice and the energy of the beam, this being predetermined empirically. This structure further includes a base contact 51 which can be formed later as well as oxide regions 53 and an isolation region 55 which is formed in the same manner as the isolation region 43. It is apparent that there is now a complete semiconductor device formed in the thin slice which is accessible from both sides of the slice and which has been formed from both sides of the slice.

Referring now to FIG. 6, there is shown the formation of a semiconductor device formed in the thin slices of the present invention. In this embodiment, the starting material is a P+ wafer 61. Isolation regions 63 are implanted therein in the same manner as described with respect to the embodiment of FIG. 5. Oxide regions 65 are formed in standard manner and then emitter region 67 and collector region 69 are formed by ion implantation from opposite sides of the thin slice in the manner above described. It can be seen that the P+ region along with the region 67 and 69 form a bipolar transistor. Furthermore, by formation of the n+ regions 71 and 73 by diffusion or ion implantation with the contact region 75, there is formed an MOS device in the same thin slice which is isolated from the bipolar transistor.

It can be seen that there have been provided methods for forming very thin semiconductor slices which are accessible from both sides and which are strong, straight and flat so that they can be handled in normal commercial processing operations without material breakage or the like. Furthermore, there have been described many embodiments of structures which can be formed therein for various uses, which uses are apparent to those skilled in the art.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:
1. A method of forming very thin semiconductor slices which comprises the steps of:
   a. providing a wafer of semiconductor material of predetermined crystallographic orientation and of predetermined conductivity type;
   b. forming a mask on a surface of said wafer;
   c. etching in said wafer through said mask to form parallelogram shaped grooves
   d. removing said mask and depositing semiconductor material in said grooves and along said surface of said wafer of the same conductivity type as said wafer but of lower dopant concentration; and
   e. removing the original wafer.
2. A method as set forth in claim 1, wherein said etch in step (c) is an orientation dependent etch.
3. A method as set forth in claim 1, wherein step (e) includes etching using an electrolytic etch.
4. A method as set forth in claim 2, wherein step (e) includes etching using an electrolytic etch.
5. A method as set forth in claim 1, wherein step (e) includes etching with a concentration dependent etch.
6. A method as set forth in claim 2, wherein step (e) includes etching with a concentration dependent etch.
7. A method as set forth in claim 1, wherein said grooves are formed in the shape of parallel struts.
8. A method as set forth in claim 6, wherein said grooves are formed in the shape of parallel struts.
9. A method as set forth in claim 1, wherein said grooves are formed in the shape of a parallelogram array.
10. A method as set forth in claim 6, wherein said grooves are formed in the shape of a parallelogram array.
11. A method of forming very thin semiconductor slices which comprises the steps of:
    a. providing a wafer of semiconductor material of predetermined conductivity type with more concentrated layer of said conductivity type at one surface;
    b. forming a mask over said layer;
    c. depositing said semiconductor material through said mask onto said layer to form an elevated pattern of said semiconductor material of said more concentrated conductivity type in the shape of the pattern of said mask;
    d. removing said mask and any material deposited thereon; and
    e. removing the portion of said wafer of predetermined conductivity type.
12. A method as set forth in claim 11, wherein step (e) comprises etching with a concentration dependent etch.
13. A method as set forth in claim 11, wherein said grooves are formed in the shape of parallel struts.
14. A method as set forth in claim 12, wherein said grooves are formed in the shape of parallel struts.
15. A method as set forth in claim 11, wherein said grooves are formed in the shape of a parallelogram array.
16. A method as set forth in claim 12, wherein said grooves are formed in the shape of a parallelogram array.

* * * * *